United States Patent [19]

Piguet

[11] 4,227,097
[45] Oct. 7, 1980

[54] LOGIC D FLIP-FLOP STRUCTURE

[75] Inventor: Christian Piguet, Neuchâtel, Switzerland

[73] Assignee: Centre Electronique Horloger, S.A., Breguet, Switzerland

[21] Appl. No.: 922,843

[22] Filed: Jul. 7, 1978

[30] Foreign Application Priority Data

Jul. 8, 1977 [CH] Switzerland .................. 8473/77

[51] Int. Cl.$^2$ .............. H03K 3/286; H03K 3/353; H03K 19/08; H03K 19/20
[52] U.S. Cl. .................................. 307/279; 307/205; 307/288
[58] Field of Search .......... 307/203, 205, 207, 220 C, 307/225 C, 272 A, 279, 289, 291, 288

[56] References Cited

U.S. PATENT DOCUMENTS

| | | | |
|---|---|---|---|
| 3,267,295 | 8/1966 | Zuk | 307/279 X |
| 3,619,644 | 11/1971 | Vittoz | 307/279 X |
| 3,679,913 | 7/1972 | Foltz | 307/225 C |
| 3,753,009 | 8/1973 | Clapper | 307/291 X |
| 3,829,712 | 8/1974 | Hama | 307/225 C |
| 3,829,714 | 8/1974 | Vittoz | 307/225 C |
| 3,928,773 | 12/1975 | Oguey et al. | 307/279 X |
| 4,057,741 | 11/1977 | Piguet | 307/279 |
| 4,140,924 | 2/1979 | Oguey et al. | 307/205 X |

FOREIGN PATENT DOCUMENTS 583483 12/1976 Switzerland .................. 307/225 C

OTHER PUBLICATIONS

Vittoz et al., "Complementary Dynamic M.O.S. Logic Circuits", *Electronics Letters*, vol. 9, No. 4, pp. 77-78, 2/22/73.
Vittoz et al., "Silicon-Gate CMOS Frequency Divider for the Electronic Wrist Watch", *IEEE-JSSC*, vol. SC-7, No. 2, pp. 100-103; 4/1972.

*Primary Examiner*—Larry N. Anagnos
*Attorney, Agent, or Firm*—Cushman, Darby & Cushman

[57] ABSTRACT

A logic D flip-flop structure is disclosed which may have a dynamic, semi-dynamic or static behaviour as far as the clock signal is concerned. The structure of the invention is particularly simple in design and has a minimum number of transistors although it is insensitive to parasitic noise which might affect the control variable D and it does not involve any logical hazards. The basic structure of the invention is schematically represented in FIG. 1.

11 Claims, 5 Drawing Figures

LOGIC D FLIP-FLOP STRUCTURE

BACKGROUND OF THE INVENTION

The present invention relates to integrated logic circuits with complementary MOS transistors and more particularly to bistable D flip-flop structures. A typical structure of the type concerned comprises at least three logic gates each formed by a first group of transistors of a first conduction type and a second group of transistors of a second conduction type, these two groups of transistors being connected in series across the terminals of a voltage supply source and their common connection point forming the output node of the gate. The conduction paths of the transistors are connected in series and/or in parallel within each group so that the conduction state of these transistors determines the potential at the output node of the gate, which potential represents the inner variable provided by this gate and may take values substantially equal to those at the two terminals of the supply voltage source, the terminal connected to the first group of transistors being at a potential 1 and that connected to the second group of transistors being at the potential 0. Each transistor is controlled either by an inner variable or by an external control variable such as D or H, H being a clock signal.

Such a structure may have a dynamic, semi-dynamic or static behaviour as far as the clock signal H is concerned. Various bistable D flip-flop structures are already known, in particular in the form of "master-slave" circuits, of circuits employing transmission gates and circuits obtained by so called "clocked circuit" techniques. A "master-slave" type circuit is disclosed for example in the U.S. Pat. No. 3,267,295. This circuit is intensitive to parasitic noise which might affect the control variable D and involves no logical hazards. This circuit however is relatively complicated because it comprises twenty-six MOS transistors. A circuit of this type is also disclosed in the catalogue of Solid State Scientific Inc., in a form allowing the same to be set to "one" and to "zero" and it comprises thirty-eight MOS transistors.

A circuit including transmission gates is described for example in the catalogue of National Semi-Conductor Corporation (circuit MM 74 C 74 Dual D Flip-Flop). This circuit is insensitive to parasitic noise affecting the control variable D. However, this circuit requires the presence of the clock variable in the true form (H) and in the inverted form ($\overline{H}$), which constitutes a drawback from the point of view of the required surface of the integrated structure. Moreover, this circuit involves a logical hazard due to the delay of $\overline{H}$ with respect to H, the variables H and $\overline{H}$ being able to momentarily take the same value and to short-circuit two nodes having different logic states. It is thus necessary to control the delay of $\overline{H}$ with respect to H to obtain correct operation. Furthermore, the production of these structures in integrated form has a number of drawbacks due to bad separation of p- and n-channel transistors of the transmission gates used in this circuit.

Circuits referred to as "clocked circuits", are also known for example in the form of a dynamic circuit described in the Swiss Pat. No. 552914, in the form of a semi-dynamic circuit as disclosed by the article "Clocked CMOS Calculator Circuit" by YASOJI SUZUKI et al., in "IEEE Journal of Solid-State Circuits, Vol. SC-8, No. 6, December 1973, page 462," or in the form of a static circuit as disclosed in the French patent application published under the No. 2102186. These circuits have a behaviour which is insensitive to parasitic noise affecting the control variable D. They require the presence of a clock variable in the true form (H) and in the inverted form ($\overline{H}$) with the disadvantage already mentioned above. Furthermore, these circuits have a logical hazard due to the delay of $\overline{H}$ with respect to H. Dynamic and semi-dynamic D flip-flop structures have further been described in the German patent application No. 25 41 255. In its dynamic version such a structure can be exempt from logical hazards. However, if the structure is simple (i.e. it includes 10 MOS transistors) it is sensitive to parasitic noise affecting the control variable D. If it is insensitive to those parasitic noise the dynamic structure needs 12 MOS transistors and is thus relatively complex. In its semi-dynamic form the structure described in the said prior patent application needs also a relatively large number of transistors.

OBJECT OF THE INVENTION

An object of the present invention is to provide a logic bistable D flip-flop structure of the type mentioned at the beginning, which is particularly simple and has a minimum number of transistors while ensuring an operation insensitive to parasitic noise which might affect the control variable D, and which does not involve any logical hazards.

DEFINITION OF THE INVENTION

The structure according to the invention which has a dynamic behaviour at least for H=1, comprises the following logic gates respectively indicated by the inner variable they provide and comprising the transistors indicated for each group, designated by their respective control variables, the series connection of these transistors being indicated by "series":

Gate A:
    first group: H
    second group: B series H

Gate B:
    first group: H series D
    second group: D series A

Gate C:
    first group: A
    second group: D series H series A.

The transistors controlled by A in the second groups of the gates B and C may be in common with these gates and the output variable of the circuit appears in the inverted form $\overline{Q}$ and is constituted by the variable C.

The logic structure of the invention, which has a static behavior at least for H=1, comprises the following logic gates and transistors designated in the same manner as above, the connection of the conduction paths of the transistors being indicated in each group by "series" or "parallel" and the assembly indicated between brackets being considered as a whole:

Gate A:
    first group: H parallel B
    second group: B series H

Gate B:
    first group: (H series D) parallel A
    second group: (E series H) parallel (D series A)

Gate C:
    first group: A
    second group: E series H

Gate E:
    first group: B second group: B.

The transistors controlled by H in the second groups of gates A and B may again be in common to these gates and the output variable of the circuit is in the inverted form $\overline{Q}$ and is constituted by the variable C.

By adjoining additional transistors to these basic structures in accordance with the invention, it is possible to obtain semi-dynamic circuits, i.e. circuits which are dynamic for one or the other of the states of H and static for the complementary state of H, or to obtain entirely static circuits. Similarly, it is possible to obtain from these structures circuits which are capable of being set to "one" and to "zero." The basic structures and the derived structures of these circuits are so-called ideal structures, i.e. structures insensitive to parasitic noise which could affect the control variable D. These structures require a minimum number of transistors and are exempt from any logical hazard.

DESIGNATION OF THE DRAWINGS

The accompanying drawings show by way of example simplified circuit diagrams of various circuits including logic structures in accordance with the invention.

DESCRIPTION OF PREFERRED EMBODIMENTS

In the circuits shown in FIGS. 1 to 5, the various MOS transistors forming the logic gates have been indicated by circles inside which the control variable applied to the gate of the corresponding transistor has been indicated, the connections shown being those of the conduction paths of the transistors. The output nodes of the logic gates are indicated by the respective inner variables A, B, C, E, F or G provided by these gates.

The transistors connected between the output nodes of the gates and the positive terminal (+) of a supply voltage source are p-channel transistors and the transistors connected between an output node and the negative terminal (−) of the voltage source are n-channel transistors. Conventionally, the potentials at the terminals (+) and (−) are respectively indicated by 1 and 0 which values also represent the possible logic levels of the control variables of the circuit.

Figure 1:
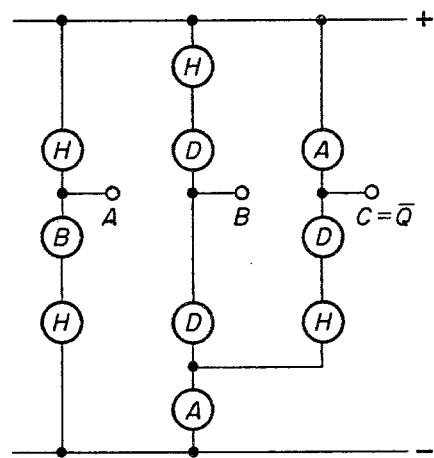
FIG. 1 shows a D flip-flop of dynamic behaviour as far as the clock signal H is concerned.

The dynamic circuit of FIG. 1 comprises three logic gates A, B and C comprising ten MOS transistors in total. The diagram of FIG. 1 shows the basic structure in accordance with the invention for circuits having a dynamic behaviour at least for H=1. The gates A, B and C of this structure are formed in a manner identical to that explained above for a structure of this type. The state of the variable H for which the structure is dynamic must occur at a relatively high frequency according to the well known principle of the so-called dynamic circuits. The output variable of this structure is in the inverted form $\overline{Q}$ and is constituted by the variable C.

TABLE I

| A B C | HD 00 | 01 | 11 | 10 |
|---|---|---|---|---|
| 0 1 1 | 111 | 111 | ⑪⑪ | ⑪⑪ |
| 1 1 1 | ⑪⑪ | 101 | — | 011 |
| 1 0 1 | 111 | ⑩⑩ | 100 | |
| 1 0 0 | 110 | ⑩⑩ | ⑩⑩ | ⑩⑩ |
| 1 1 0 | ⑩⑩ | 100 | — | 010 |
| 0 1 0 | | | | 011 |

The behaviour of the circuit shown in FIG. 1 can be illustrated by the table (table I) in which lines indicate the states of the circuit and the columns indicate the various combinations of the input variables. The encircled states in this table represent the various stable states of the circuit. The conduction functions of each group of transistors can be indicated, in accordance with the article "Complementary Dynamic MOS Logic Circuits," by E. Vittoz and H. Oguey, Electronics Letters, 22nd February, 1973, Vol. 9, No. 4, by means of logic equations.

The logic equations of the structure of FIG. 1 are as follows:

$$A^+ = \overline{H}$$

$$A^- = BH$$

$$B^+ = \overline{D+H}$$

$$B^- = AD$$

$$C^+ = \overline{A}$$

$$C^- = AHD$$

Figure 2:
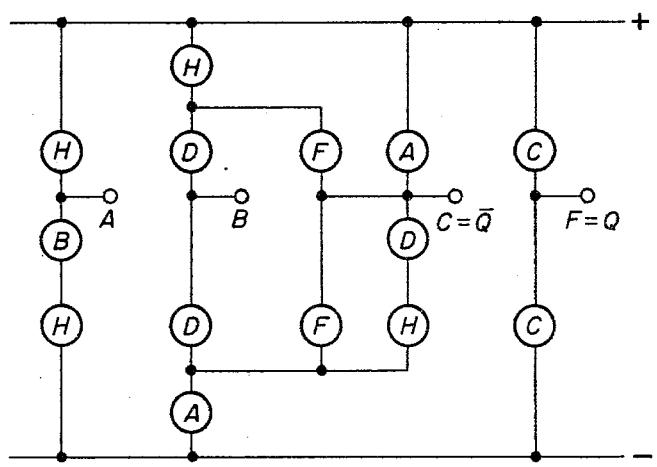
FIG. 2 shows a semi-dynamic D flip-flop, which is dynamic for H=1 and static for H=0.

FIG. 2 shows a semi-dynamic circuit obtained from the structure according to FIG. 1 by adjoining four MOS transistors so as to form four gates A, B, C and F as follows:

Gate A:
  first group: H
  second group: B series H

Gate B:
  first group: H series D
  second group: D series A

Gate C:
  first group: (H series F) parallel A
  second group: (F parallel (D series H) series A Gate F:
  first group: C
  second group: C The circuit of FIG. 2 thus comprises fourteen MOS transistors. It has a dynamic behaviour for H=1 and a static behaviour for H=0; the output variable Q is constituted by the variable F, $\overline{Q}$ being the variable C. The behaviour of this circuit can be illustrated by table II and the corresponding logic equations are as follows:

$$A^+ = \overline{H}$$

$$A^- = BH$$

$$B^+ = \overline{D+H}$$

$$B^- = AD$$

$$C^+ = \overline{A(F+H)}$$

$$C^- = A(F+HD)$$

$$F^+ = \overline{C}$$

$$F^- = C$$

Figure 3:
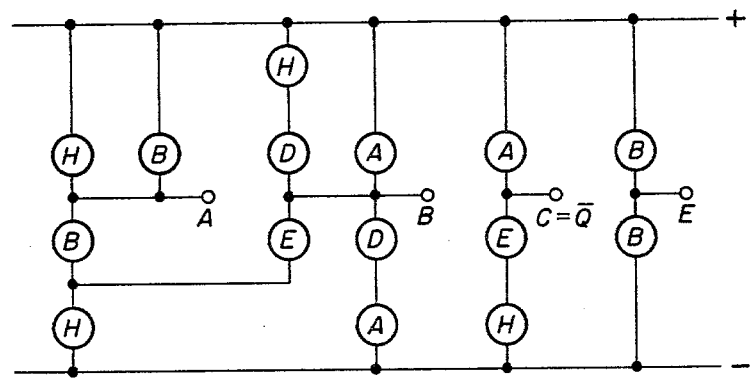
FIG. 3 shows another semi-dynamic D flip-flop, i.e. dynamic for H=0 and static for H=1.

Another semi-dynamic structure, which is dynamic for H=0 and static for H=1, is shown in FIG. 3. It also comprises four gates which are composed as follows:

Gate A:
 first group: H parallel B
 second group: B series H

Gate B:
 first group: (H series D) parallel A
 second group: (E series H) parallel (D series A)

Gate C:
 first group: A
 second group: E series H

Gate E:
 first group: B
 second group: B

TABLE II

| A B C F | HD 00 | 01 | 11 | 10 |
|---|---|---|---|---|
| 0 1 1 0 | 1110 | 1110 | (0110) | (0110) |
| 1 1 1 0 | (1110) | 1010 | — | 0110 |
| 1 0 1 0 | 1110 | (1010) | 1000 | — |
| 1 0 0 0 |  |  | 1001 |  |
| 1 0 0 1 | 1101 | (1001) | (1001) | (1001) |
| 1 1 0 1 | (1101) | 1001 |  | 0101 |
| 0 1 0 1 |  |  |  | 0111 |
| 0 1 1 0 |  |  |  | 0110 |

As shown in the drawing, the transistor controlled by H in the second groups of gates A and B is common to these gates. The circuit comprises fifteen MOS transistors. The output variable is in the inverted form $\overline{Q}$ and is constituted by the variable C.

The logic equations of this circuit are as follows:

$$A^+ = \overline{BH}$$

$$A^- = BH$$

$$B^+ = \overline{A(D+H)}$$

$$B^- = AD + EH$$

$$C^+ = \overline{A}$$

$$C^- = EH$$

$$E^+ = \overline{B}$$

$$E^- = B$$

Figure 4:
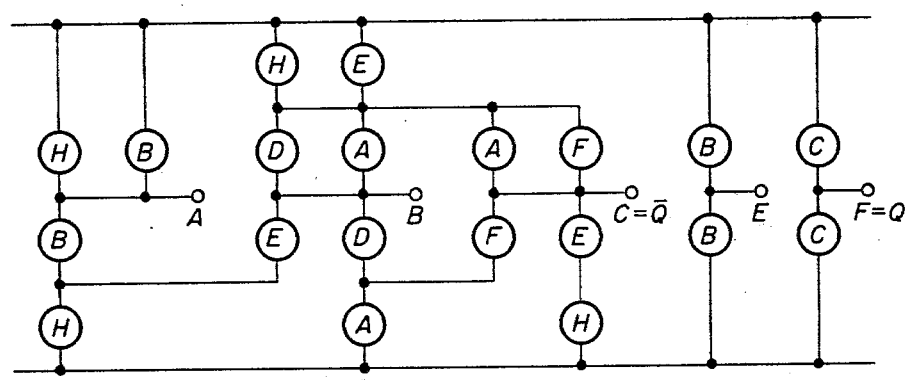
FIG. 4 shows a static D flip-flop.

FIG. 4 shows the circuit diagram of a static D flip-flop structure which is obtained by adjoining five MOS transistors to the circuit of FIG. 3. This flip-flop comprises the five following logic gates:

Gate A:
 according to FIG. 3

Gate B:
 first group: (H parallel E) series (D parallel A)
 second group: (E series H) parallel (D series A)

Gate C:
 first group: (H parallel E) series (A parallel F)
 second group: (F series A) parallel (E series H)

Gate E:
 according to FIG. 3

Gate F:
 first group: C
 second group: C

The transistor controlled by H in the second groups of gates A and B is common to these gates. The same applies to the circuit part (H parallel E) in the first groups of gates B and C, and to the transistor controlled by A in the second groups of these gates. The circuit thus comprises twenty MOS transistors. The output variables Q and $\overline{Q}$ are respectively represented by F and C.

The behaviour of the static circuit of FIG. 4 can be described by table III. The logic equations of this circuit are as follows:

$$A = \overline{BH}$$

$$B = \overline{AD + EH}$$

$$C = \overline{AF + EH}$$

$$E = \overline{B}$$

$$F = \overline{C}$$

The circuits shown in FIGS. 1 to 4 can be completed by introducing two supplementary control variables to obtain circuits capable of being set to "one" and to "zero." According to the conventional terminology, these two supplementary variables are indicated by S (Set) for setting to "one" and by R (Reset) for setting to "zero."

TABLE III

| A B C E F | HD 00 | 01 | 11 | 10 |
|---|---|---|---|---|
| 0 1 1 0 0 | 11100 | 11100 | (01100) | (01100) |
| 1 1 1 0 0 | (11100) | 10100 | — | 01100 |
| 1 0 1 0 0 |  | 10110 |  |  |
| 1 0 1 1 0 | 11110 | (10110) | 10010 | — |
| 1 1 1 1 0 | 11100 |  |  |  |
| 1 0 0 1 0 |  |  |  |  |
| 1 0 0 1 1 | 11011 | (10011) | (10011) | (10011) |
| 1 1 0 1 1 | 11001 |  |  |  |
| 1 1 0 0 1 | (11001) | 10001 | — | 01001 |
| 1 0 0 0 1 |  | 10011 |  |  |
| 0 1 0 0 1 |  |  |  | 01101 |
| 0 1 1 0 1 |  |  |  | 01100 |

Figure 5:
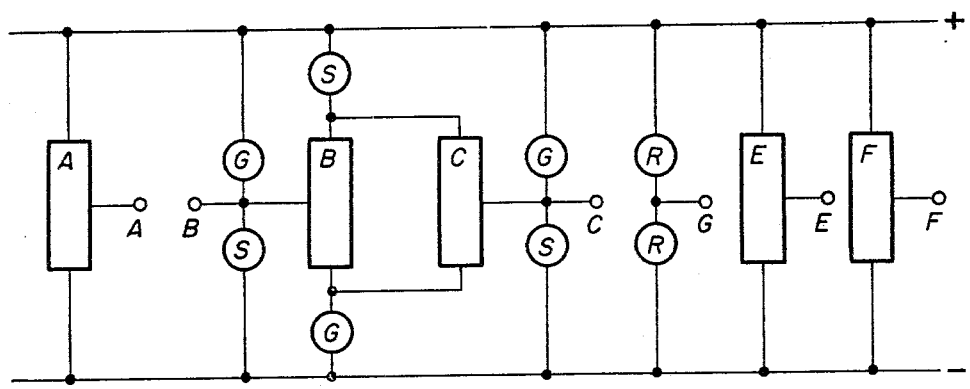
FIG. 5 shows the general form of a circuit capable of being set to "one" and to "zero," the circuit being derived from one of the preceding circuits.

FIG. 5 shows the general diagram of such a circuit in which the gates A, B, C, E, F have the configuration previously described with reference to the respective dynamic, semi-dynamic or static circuits. A supplementary logic gate G is added to the circuit, which gate comprises a p-channel transistor and an n-channel transistor, these two transistors being controlled by the variable R. Furthermore, the gates B and C comprise two common supplementary transistors respectively connected in series with the first and second groups of these gates, which transistors are respectively controlled by the variable S and the inner variable G. Finally, a transistor controlled by G is connected in parallel with the transistor assembly of the first group and a transistor controlled by S is connected in parallel with the transistor assembly of the second group in each of the said gates B and C completed by the said series connected supplementary transistors.

The logic equations of a bistable D flip-flop structure with a static behaviour and the possibility of being set to "one" and to "zero" according to FIG. 5 are as follows:

$A = \overline{BH}$ $B = \overline{S + G(AD + EH)}$ $C = \overline{S + G(AF + EH)}$ $E = \overline{B}$ $F = \overline{C}$ $G = \overline{R}$ This static circuit thus comprises twenty-eight MOS transistors, whereas the equivalent "master-slave" flip-flops need thirty-eight MOS transistors (catalogued by Solid State Scientific Inc., —CMOS Integrated Circuits, year 1976, page 36, circuit SLC 4013A.).

All the structures according to the invention are ideal structures, i.e. they do not react to an impulse of the control variable D during the time interval in which the clock H does not change.

Moreover, from the state tables of the above described circuits it will appear that each state differs from the following one only by one variable. In other words, between two successive states, only one of the variables changes its state so that any race between two variables which would result in a logical hazard is avoided. The circuits according to the invention therefore do not involve any logical hazard.

What is claimed is:

1. A logic bistable D flip-flop structure capable of being realized in integrated circuit technology with complementary MOS transistors, comprising at least three logic gates each of which comprises a first group of transistors of a first conduction type and a second group of transistors of a second conduction type, these two groups of transistors being connected in series across the terminals of a voltage supply source and their common connection point forming the output node of the gate, the conduction paths of the transistors of each group being connected in series and/or in parallel with each other so that the conduction state of these transistors defines the potential at the output node of the gate, which represents the inner variable provided by this gate and may take values substantially equal to those at the two terminals of the voltage supply source, the terminal connected to the first group of transistors having a potential 1 and the terminal connected to the second group of transistors the potential 0, each transistor being controlled by an inner variable or by an external control variable such as D or H, where H is a clock signal, the said structure having a dynamic behavior at least for H=1 and comprising the following logic gates respectively indicated by the inner variable they provide, said gates being formed by transistors indicated for each group and designated by their respective control variables, the series connection of these transistors being indicated by "series":

Gate A:
   first group: H
   second group: B series H
Gate B:
   first group: H series D
   second group: D series A
Gate C:
   first group: A
   second group: D series H series A,
the transistor controlled by A in the second groups of gates B and C being preferably common to these gates and the output variable of the circuit being in the inverted form $\overline{Q}$ and being constituted by the variable C.

2. A logic structure as claimed in claim 1 forming a circuit having a semi-dynamic behaviour, namely dynamic for H=1 and static for H=0, and comprising the following logic gates, the connection in parallel of the conduction paths of the transistors being indicated by "parallel" and an assembly indicated between brackets being considered as a whole:

Gate A:
   first group: H
   second group: B series H
Gate B:
   first group: H series D
   second group: D series A
Gate C:
   first group: (H series F) parallel A
   second group: (F parallel (D series H)) series A
Gate F:
   first group: C
   second group: C,
the transistor controlled by H in the first groups of gates B and C and the transistor controlled by A in the second groups of gates B and C being preferably common to these gates, the output variable Q of the circuit being the variable F and the inverted output variable $\overline{Q}$ being the variable C.

3. A logic bistable D flip-flop structure capable of being realized in integrated circuit technology with complementary MOS transistors, comprising at least four logic gates each formed by a first group of transistors of a first conduction type and a second group of transistors of a second conduction type, these two groups of transistors being connected in series across the terminals of a voltage supply source and their common connection point forming the output node of the gate, the conduction paths of the transistors of each group being connected in series and/or in parallel with each other, so that the conduction state of these transistors defines the potential at the output node of the gate, which represents the inner variable provided by this gate and may take values subtantially equal to those at the two terminals of the voltage supply source, the terminal connected to the first group of transistors having a potential 1 and the terminal connected to the second group of transistors having the potential 0, each transistor being controlled by an inner variable or by an outer control variable such as D or H, where H is a clock signal, the said structure having a static behaviour at least for H=1 and comprising the following logic gates respectively indicated by the inner variable they provide and comprising transistors indicated for each group and designated by their respective control variables, the connection of the conduction paths of these transistors being indicated in each group by "series" or "parallel", and an assembly indicated between brackets being considered as a whole:

Gate A:
   first group: H parallel B
   second group: B series H
Gate B:
   first group: (H series D) parallel A
   second group (E series H) parallel (D series A)
Gate C:
   first group: A
   second group: E series H
Gate E:
   first group: B second group: B,
the transistor controlled by H in the second groups of gates A and B being preferably common to these gates and the output variable of the circuit being in the inverted form $\overline{Q}$ and being formed by the variable C.

4. A logic structure as claimed in claim 3 forming a circuit with static behaviour and comprising the following logic gates:

Gate A:
    first group: H parallel B
    second group: B series H

Gate B:
    first group: (H parallel E) series (D parallel A)
    second group: (E series H) parallel (D series A)

Gate C:
    first group: (H parallel E) series (A parallel F)
    second group: (F series A) parallel (E series H)

Gate E:
    first group: B
    second group: B

Gate F:
    first group: C
    second group: C, the transistor controlled by H in the second groups of gates A and B being preferably in common to these gates, the (H parallel E) assembly in the first groups and the transistor controlled by A in the second groups of the gates B and C being preferably in common to these gates, and the output variable Q being the variable F, the inverted output variable $\overline{Q}$ being the variable C.

5. A logic structure as claimed in any one of the claims 1 to 4, wherein at least two transistors of the same conduction type, which are connected in series, are subjected to permutation.

6. A logic structure as claimed in any one of the claims 1 to 4, wherein the said first conduction type is type p and the said second conduction type is type n.

7. A logic structure as claimed in any one of the claims 1 to 4, wherein the said first conduction type is type n and the said second conduction type is type p.

8. A logic structure as claimed in any one of the claims 1 to 4 forming a circuit capable of being set to "one" and "zero" by means of outer control variables S and R, values S=1 and R=1 producing respective states Q=1 and Q=0, wherein said structure comprises in addition a logic gate G including a transistor of the first conduction type and a transistor of the second conduction type, each controlled by R, and wherein the gates B and C comprise a first supplementary common transistor controlled by S, connected in series with the transistors of the first group, and a second supplementary common transistor controlled by G, connected in series with the transistors of the second group, a further transistor controlled by G being connected in parallel with the assembly of the transistors of the first group and a further transistor controlled by S being connected in parallel with the assembly of the transistors of the second group in each of the gates B and C completed by the said supplementary series connected transistors.

9. A logic structure as claimed in claim 8, wherein at least two transistors of the same conduction type, which are connected in series, are subjected to permutation.

10. A logic structure as claimed in claim 8, wherein the said first conduction type is type P and the said second conduction type is type n.

11. A logic structure as claimed in claim 8, wherein the said first conduction type is type n and the said second conduction type is type p.

* * * * *